United States Patent
Goruganthu et al.

(10) Patent No.: US 6,833,716 B1
(45) Date of Patent: Dec. 21, 2004

(54) ELECTRO-OPTICAL ANALYSIS OF INTEGRATED CIRCUITS

(75) Inventors: Rama R. Goruganthu, Austin, TX (US); Michael R. Bruce, Austin, TX (US); Greg Dabney, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 263 days.

(21) Appl. No.: 10/113,620

(22) Filed: Mar. 29, 2002

(51) Int. Cl.⁷ .............................................. G01R 31/26
(52) U.S. Cl. ...................... 324/750; 324/752; 324/753
(58) Field of Search ...................... 324/750, 751–753, 324/765, 96, 501; 356/401, 445; 250/341.4, 310; 438/12–14, 17–18

(56) References Cited

U.S. PATENT DOCUMENTS 5,638,005 A * 6/1997 Rajan et al. ................ 324/751
6,326,798 B1 * 12/2001 Kuribara ..................... 324/751
6,653,849 B1 * 11/2003 Bruce et al. ................ 324/751

* cited by examiner

Primary Examiner—Vinh P. Nguyen

(57) ABSTRACT

An integrated circuit die having silicon on insulator (SOI) structure is analyzed in a manner that improves the ability to obtain a signal from the SOI structure. According to one example embodiment, a stimulating device is adapted to stimulate an integrated circuit having SOI structure. An electro-optic probe arrangement is focused on a selected portion of the integrated circuit in a manner that makes possible the detection of a response to the stimulation from the SOI selected portion. In this manner electro-optic probing portions of an integrated circuit having SOI structure is enhanced.

20 Claims, 6 Drawing Sheets

ELECTRO-OPTICAL ANALYSIS OF INTEGRATED CIRCUITS

FIELD OF THE INVENTION

The present invention relates generally to semiconductor devices and their fabrication, and more particularly, to techniques for analyzing circuitry within an integrated circuit.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors operating at speeds of hundreds of millions of instructions per second to be packaged in relatively small, air-cooled semiconductor device packages.

As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

One analysis method involves electro-optic probing of traditional CMOS circuits using, for example, an electro-optic probe commercially available from Schlumberger, ATE Division. Electro-optic probing of voltage waveforms in typical CMOS circuits is possible because a response from an active region in the circuit is generally readily detectable through silicon. For example, source/drain (S/D) regions in CMOS circuits make p-n junctions with well regions. A depletion region exists at the junctions and has a strong electric field responsible for changes in refractive index and in the light absorption coefficient of silicon at the junction. When examined through the bulk silicon, the relatively uncomplicated structure of the CMOS circuits in the junction regions and the strong electric field exhibited by the depletion region both support electro-optic probing of traditional CMOS circuits, whereby a response from the circuits can be detected.

For CMOS circuits using silicon on insulator (SOI) structure, the transistor is fully (both laterally and vertically) isolated and the S/D diffusions extend down to the insulator layer in the SOI structure. Hence, the p-n junctions that exist between the S/D regions and the well in traditional CMOS circuits are absent in SOI circuits. This transistor structure also decreases the drain capacitance substantially, resulting in a faster switching transistor. The absence of the above-mentioned p-n junctions presents challenges to the electro-optic probing of CMOS circuit dies having SOI structure.

In CMOS and other circuits employing SOI structures, interfaces between the different materials in the SOI structures make it difficult to obtain an optical response, for example, due to changes in refractive index that occur at each interface. These changes in refractive index result in undesired reflected light. This undesired reflected light constitutes the background portion of the total (signal+background) reflected light captured by a probe. The background light interferes with the signal, or that portion of the reflected light that is useful, for example, for analyzing circuit functions. Additionally, light reflecting off the interfaces does not impede upon the intended circuitry of interest (e.g., target circuitry). This diminishes the intensity of the light reflected back to the probe from the circuitry of interest, again presenting challenges to circuit analysis.

SUMMARY OF THE INVENTION

The present invention is directed to approaches for overcoming the above and other challenges to analyzing a semiconductor device having SOI structure, as exemplified in a number of implementations and applications, some example aspects of which are summarized below.

According to an example embodiment of the present invention, an electro-optic probe is directed at a selected portion of an integrated circuit die having silicon on insulator (SOI) structure. The integrated circuit die is stimulated, and the electro-optic probe is dynamically focused at the selected circuit portion, using select variations in focus parameters (e.g., small adjustments in correction ring settings of a microscope portion of the electro-optic probe). A response of the selected circuit portion to the focused electro-optic probe is detected and used for analyzing the integrated circuit die. In one implementation, the response includes a voltage waveform at selected focus settings, and the waveform is used to analyze a circuit characteristic (e.g., a voltage state) of the integrated circuit device.

According to another example embodiment of the present invention, an electro-optic crystal is positioned at a selected portion of the integrated circuit die, and a probe is directed thereto. The integrated circuit die is stimulated and a response of the crystal to the stimulation is detected in this manner, probing of an integrated circuit die having SOI structure is achieved, and electrical characteristics of the die are readily detected via the response of the crystal.

According to another example embodiment of the present invention, an integrated circuit die having SOI structure layer is analyzed with an electro-optic probe via an exposed portion of the insulator having an anti-reflective coating thereon. The anti-reflective coating inhibits unwanted reflections from the die during probing. The integrated circuit die is stimulated, and the electro-optic probe is focused to a selected portion of the chip circuitry. A response from the probe is detected and the die is analyzed therefrom.

In another example embodiment, a refractive index matching fluid is placed onto an exposed portion of the insulator of a SOI structure. An anti-reflective coating is then introduced above the exposed insulator layer by placing an optically transparent substrate that incorporates an anti-reflective coating, such as on a top or bottom side of the substrate. The chip is then stimulated. The electro-optic probe is focused to the SOI structure through the optically transparent substrate and the index matching fluid, thereby generating an optical response suitable for analysis of the die. Reflections from the beam are inhibited by the antireflective coating, improving the ability to detect the optical response. In a more particular implementation, an anti-reflective coating is placed on the exposed portion of the insulator prior to placing the index matching fluid.

In another example embodiment, a system is arranged for analyzing an IC die having SOI structure with a probe. The system includes a stimulation device adapted to stimulate the integrated circuit die and effect a response of the die, and in one implementation, to effect a response of an electro-optic crystal located at the die. A detection arrangement is configured and arranged to detect a response of the die, directly and/or indirectly (e.g., using the electro-optic crystal).

The above summary is not intended to describe each illustrated embodiment or every implementation. The figures and detailed description that follow more particularly exemplify these embodiments.

BRIEF DESCRIPTION OF THE DRAWINGS

The method may be more completely understood in consideration of the following detailed description of various embodiments in connection with the accompanying drawings, in which.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and has been found particularly suited to optical analysis of integrated circuits having silicon on insulator (SOI) structure. While not necessarily limited to such devices, various aspects may be appreciated through a discussion of various examples using this context.

According to an example embodiment of the present invention, an electro-optic probe is employed for making non-contact electro-optical measurements of electrical signals from sub-micron devices and structures, such as integrated circuits having SOI structure. In connection with this example embodiment, it has been discovered that electro-optic probing of SOI structure can be accomplished using a method of dynamic focusing. In one example approach that is consistent with the present invention, the focus of the electro-optic probe is changed in small selected variations, thereby attaining a voltage waveform response from the SOI structure at certain selected focus settings.

A response to the electro-optic probe can be obtained from various sources. For example, as the free carrier density in drain regions of the SOI structure varies, a response such as a variation in the intensity and/or phase of light reflected from the structure can be detected. These variations can be attributed to changes in properties of the drain regions including the absorption coefficient and refractive index. In one implementation, variation in the free carrier density results from the application of a selected stimulus that causes a change in the voltage of the drain region. In another implementation, the response includes a change in free carrier density that is affected by lateral p-n junctions that exist between the body of the SOI structure and the source/drain region.

The probe is dynamically focused in the transistor area of the circuit and signal measurements of high intensity are obtained. A sampling laser beam of short pulses is focused on the SOI integrated circuit in the region of the transistor area. By electro-optical sampling, the signal can be extracted and displayed with high resolution. The spatial resolution is determined by the size of the beam cross section (laser spot) in the electro-optic probe.

Figure 1:
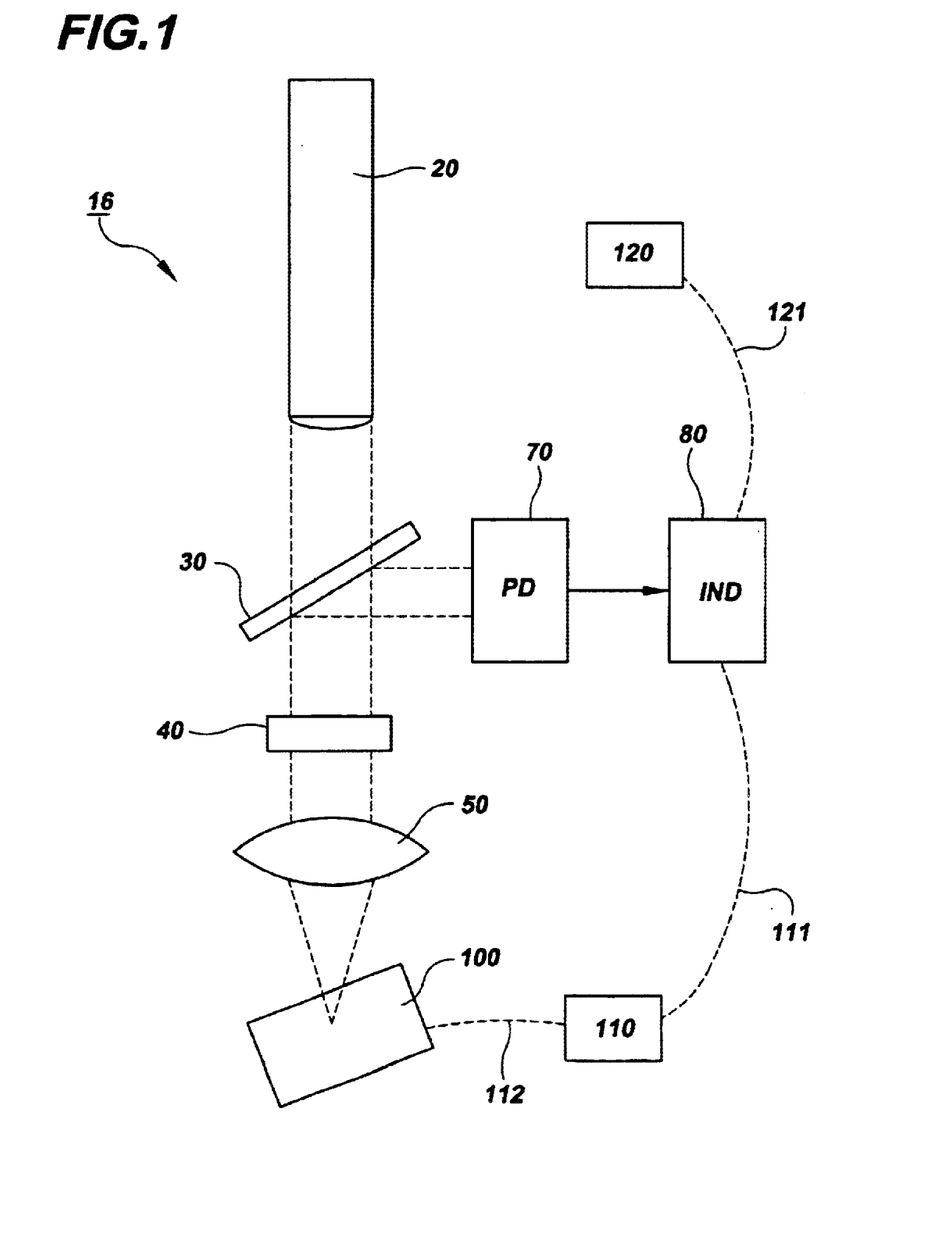
FIG. 1 shows an integrated circuit die having SOI structure undergoing analysis, according to an example embodiment of the present invention.

FIG. 1 shows an integrated circuit 100 undergoing electro-optic probe analysis, according to another example embodiment of the present invention. The electro-optic probe system 16 contains a laser source 20 positioned above a test integrated circuit die 100. The laser source 20 directs a beam through a partially transmitting mirror 30, a correction ring 40, and an objective lens 50 where the beam focuses upon the integrated circuit die 100 in the region of the transistor circuitry of interest. The correction ring 40 of the probe system 16 compensates for the refraction of the interface between one or more substances present in the integrated circuit die 100. The laser beam traverses the integrated circuit die 100, and reflects back through the various materials. The reflected laser beam passes through the objective lens 50, the correction ring 40, and the partially transmitting mirror 30 reflects the beam to a photo detector 70 coupled to an indicator or signal recorder 80, which detects an electrical response of the photo detector 70.

In one implementation, the electro-optic probe system 16 is adapted for testing and analyzing SOI flip chips from a backside of the chip, the backside being opposite the chip portion containing the circuitry. Between a flip chip's backside surface and the circuitry of interest, a flip chip SOI structure typically includes three interfaces due to the presence of a buried insulator layer (e.g., a buried oxide layer); these layers are; an air-to-silicon interface, a silicon-to-silicon-oxide interface, and a buried insulator-to-silicon interface.

Dynamically focusing an image from the SOI transistor can be accomplished, for example, using a known setting for analyzing a bulk silicon chip as a starting point for the correction ring 40. The objective lens 50 is then focused to obtain an image or response on the indicator or recorder 80. The circuit 100 is then probed with a suitable stimulus signal and, when the focus of the system is proper, a waveform signal is recorded that is sufficient for use in analyzing the transistor. It may be helpful to variably readjust the position of the correction ring 40 and then refocus the objective lens 50, and again apply a stimulus signal. This readjusting and refocusing helps to obtain a suitably strong waveform signal (e.g., a signal that is sufficient for detecting a circuit state of the die 100). This variable adjustment can be achieved, for example, by adjusting the correction ring 40 above and below a selected setting in selected variations until an adequate signal is obtained.

In another example embodiment of the present invention, the system 16 in FIG. 1 further includes a stimulation device 110 electrically coupled to the die via communications link 112 and adapted to provide a test signal. The stimulation device 110 is used in conjunction with the indicator/recorder 80 to analyze the die 100 via communications link 111. For instance, a response from the die can be determined to coincide with the timing of the application of a selected stimulus.

In still another example embodiment of the present invention, the system 16 in FIG. 1 further includes an analysis device 120, such as a computer, coupled to the indicator/recorder 80 via communications link 121 and to the stimulation device (e.g., via communications link 111). The analysis device 120 is adapted to provide a user interface for observing the response from the die 100. In one implementation, the analysis device 120 includes a display adapted to display a voltage waveform, such as one or more of the waveforms shown in FIG. 3, discussed below.

Figure 2:
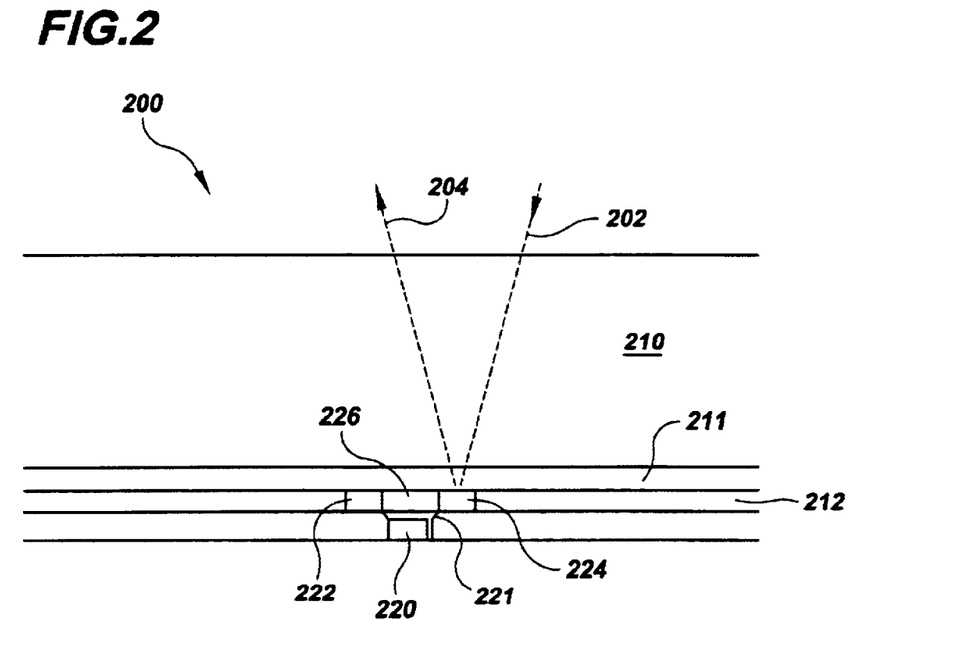
FIG. 2 illustrates an optical beam passing through and reflected from a SOI structure from the backside, consistent with another example embodiment of the invention described herein.

FIG. 2 shows an integrated circuit die 200 having SOI structure undergoing analysis, according to another example embodiment of the present invention. The analysis of the die 200 may be implemented, for example, in connection with the example embodiments described in connection with FIG. 1 (e.g., as die 100). The die 200 includes a buried insulator layer 211 having a transistor including source/drain regions 222 and 224 formed in a silicon substrate 212 on the buried insulator layer 211, and having a gate 220 separated from a channel region 226 by a dielectric material 221. Light 202 is directed to the source/drain region 224 and a reflection 204 thereof is detected using, for example, the arrangement shown in FIG. 1, as well as the focusing discussed in connection therewith.

Figure 3:
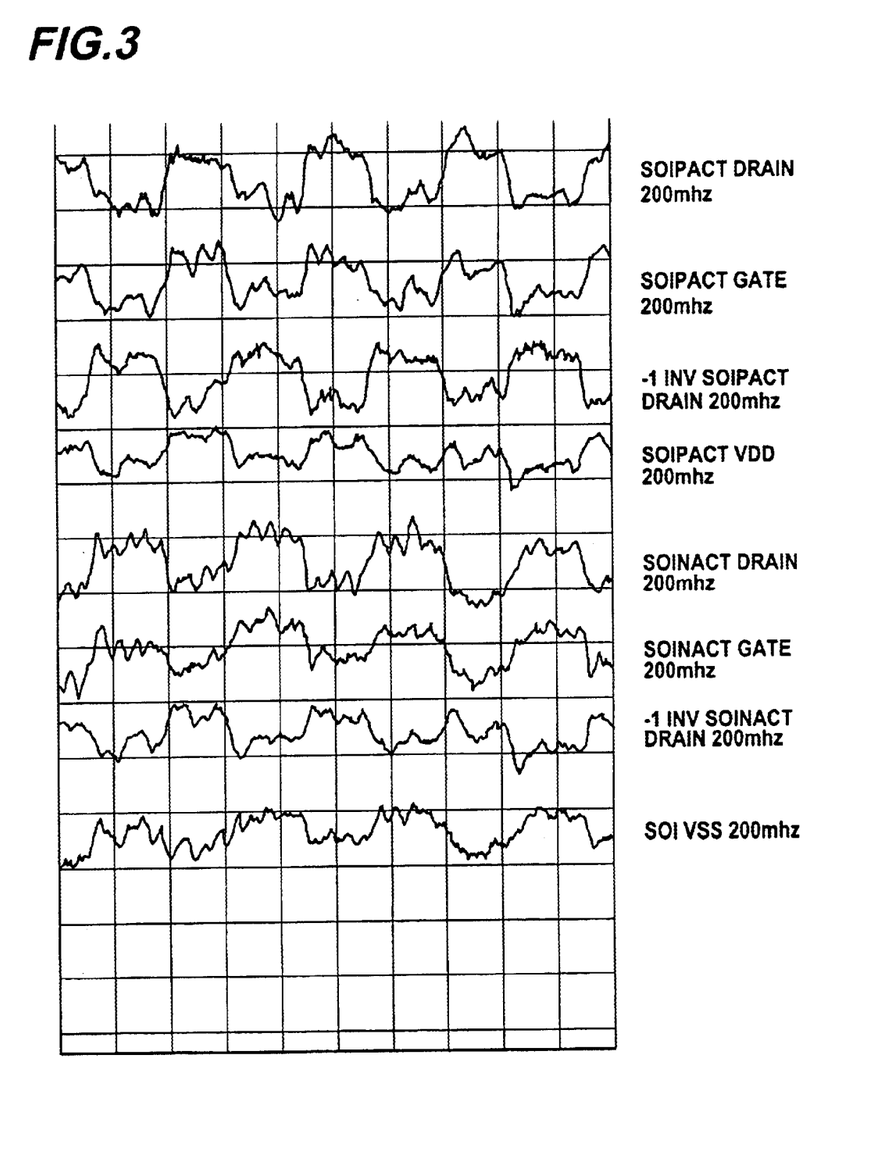
FIG. 3 is a graphic representation of the voltage waveforms acquired from an electro-optic probe system during stimulation of a chain of CMOS inverters built in SOI material, consistent with another example embodiment of the invention.

In another particular application of the invention, the integrated circuit 100 of FIG. 1 includes a chain of CMOS inverters built in SOI material. Clock pulses having a range of between about 200–400 MHz are applied to stimulate the integrated circuit 100. The electro-optic probe system 16 is positioned adjacent the backside of the integrated circuit 100 and is used to focus an optical beam on at least one drain region of a transistor of the integrated circuit 100 and detect a response of the stimulated circuit. Example responses include voltage waveforms acquired from the electro-optic system detector 70, such as shown in FIG. 3 and discussed below. Such voltage changes may, for example, cause a change in the free carrier density that can be detected using the probe system 16.

Voltage waveforms, such as those shown by way of example in FIG. 3, can be used to detect a defect or verify performance of an integrated circuit die in various manners. Variations in the waveforms, such as a shift in phase of the waveforms and/or a change in intensity of the waveforms, are particularly useful for detecting circuit characteristics of SOI circuitry. For instance, voltage waveforms detected from a die being analyzed can be compared to a reference waveform from a reference die known to have a particular defect. If the waveforms match, the die being analyzed is identified as having a defect that is the same as or similar to a defect present in the reference die. The waveform can also be compared to the waveform of a die that is known to be non-defective, and variations in the comparison of the waveforms from each die can then be used as an indication of a defect.

In one implementation, the device is stimulated in a manner that causes changes in carrier density in the drain diffusion regions of the SOI device. The changes in carrier density result in changes in the amount of heat generation, which affects the refractive index of silicon in the drain region. Light that passes through and is reflected by the device is affected by this change. The electro-optic probe detects changes in refractive index of silicon in the drain region by detecting a phase change in light reflected from the device. This detected phase change may, for example, be detected as a fringe pattern.

Similarly, changes in carrier density affect the light absorption coefficient of silicon in the drain region. As the free carrier density in the silicon present in the drain region changes, the amount of light incident upon the silicon that is absorbed changes. The electro-optic probe detects changes in the light absorption coefficient by detecting, for instance, changes in intensity of the reflected light. The detected intensity changes are used to detect a change in the free carrier density, which is used for analyzing the device.

In another example embodiment of the present invention, the device is stimulated in a manner that causes a change in an elector-optic response that results from interactions between the lateral p-n junctions that exist between the source/drain regions and the body of a SOI device. These response changes can be used, for example, to detect a response from the device as described hereinabove in connection with changes in free carrier density in drain regions.

In another particular implementation of the invention, a test pattern is applied to a device to stimulate the SOI circuit. The test pattern may include, for example, a series of voltage inputs to the circuit. The test pattern simulates operating characteristics that potentially can cause circuit failure. In addition, the test pattern can be applied in a loop to cycle the circuit through multiple failure conditions. An electro-optic probe then detects an optical response from the circuit that is receiving the looped test pattern, and the optical response is used to detect a characteristic of the SOI circuit. In this regard, FIG. 3 shows example responses in the form of voltage waveforms acquired from an electro-optic detector, with an optical characteristic (e.g., intensity) being represented by voltage.

According to another example embodiment of the present invention, an electro-optic probe is employed in combination with one or more anti-reflective coatings to make non-contact electro-optical measurements of electrical signals from submicron devices and structures, including integrated circuits having SOI structure. As discussed above, integrated circuits having SOI structure do not have a well, and therefore, do not have p-n junctions between S/D regions and the well region. Additionally, the interfaces present in an SOI structure interfere with the efficient signal acquisition of an electro-optic probe. The use of anti-reflective coatings addresses these and other characteristics that inhibit traditional electro-optical probing.

In one example embodiment, sufficiently focusing an electro-optical probe at the backside of an IC die having SOI structure and incorporating an anti-reflective coating permits the capture of high modulation depth signals. The anti-reflective coating maximizes the reflected light from the diffusion regions by minimizing or eliminating undesired background reflections from interfaces in the system. Minimizing unwanted reflections allows more of the electro-optic probe laser beam to penetrate to the diffusion regions of the integrated circuit die, and thereby returns a stronger reflected signal off of the circuitry of interest. Additionally, the detection of the reflected signal is enhanced by inhibiting unwanted background noise of reflections from interfaces within the system.

In one example embodiment of the present invention, an integrated circuit die is prepared by removing a backside silicon layer and thereby exposing the insulator layer of SOI structure in the die. An anti-reflective coating is formed on the exposed insulator, the die is stimulated and an electro-optic probe is then used to obtain a response from the die via the anti-reflective coating. The elimination of the silicon/insulator interface in conjunction with the use of an anti-reflective coating minimizes or eliminates the reflected light from interfaces within the system during probing. The response obtained with the electro-optic probe is used for analyzing the die.

In some applications, a die to be analyzed is received having an insulator portion of SOI structure in the die exposed. In another example application, silicon substrate over the SOI structure must be removed. Removal of a silicon substrate involves a twostep process. First, the silicon die surface is mechanically ground until approximately 20–100 micrometers of silicon remains. Second, the remaining portion of the silicon layer is etched using 15–25% by weight of TMAH (tetramethyl ammonium hydroxide) in water at 70–90 degrees C., thereby exposing the insulator layer over the entire surface.

Figure 4:
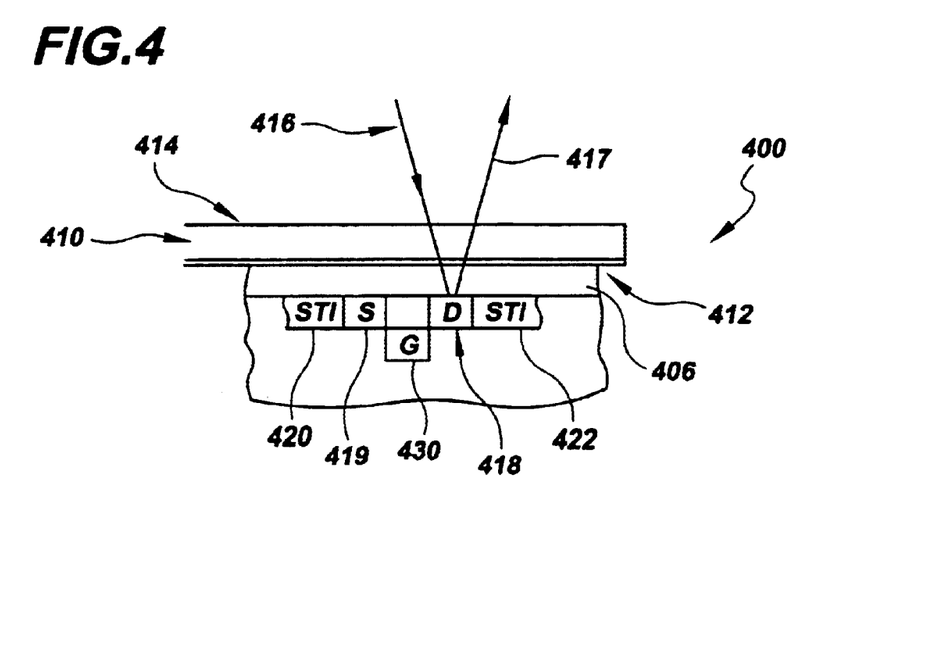
FIG. 4 is an integrated circuit die having SOI structure undergoing analysis, according to another example embodiment of the present invention.

FIG. 4 shows an integrated circuit die 400 having SOI structure and undergoing analysis, according another example embodiment of the present invention. The die includes a transistor having a gate 430 and source/drain regions 418 and 419, with shallow trench isolation (STI) regions 420 and 422 electrically isolating the source/drain regions from adjacent circuitry. A portion of a buried insulator layer 406 of the SOI structure is exposed, a refractive index matching fluid 412 is formed on the exposed insulator layer 406 and an optically-transparent substrate 410 having one or more anti-reflective coatings 414 is disposed on the refractive index matching fluid 412. The index matching fluid 412 is matched to the refractive index of either the insulator or the optically transparent substrate and is placed between these two layers to compensate for any surface irregularities. The anti-reflective coating is deposited on the top, bottom, or both top and bottom surfaces of the optically transparent substrate 410, depending upon the desired characteristics of the resulting structure.

The anti-reflective coatings shown in FIG. 4 can be incorporated onto other combinations of surfaces. For example, in addition to anti-reflective coatings on the top and/or bottom surfaces of the optically transparent substrate, the insulator surface also incorporates an anti-reflective coating in another example embodiment of the present invention. The particular anti-reflective coating used is dependent on the indices of refraction of the two substances creating the interface, and the wavelength of the laser used in the electro-optic probe.

Light 416 (e.g., a laser beam) is directed at the circuitry of interest, and, after penetrating the various layers, reflects from a probed drain diffusion region 418. Unwanted reflections, such as from interfaces in the die, are inhibited by the anti-reflective coating or coatings. A portion 417 of the light reflects back to the probe from the circuitry of interest, and is detected and used to analyze the die.

Figure 5:
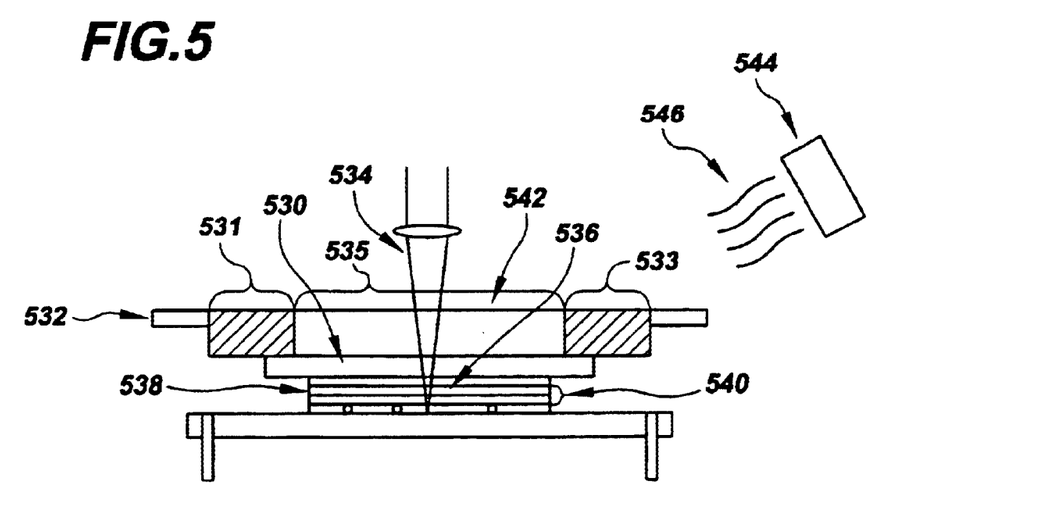
FIG. 5 is an integrated circuit die having SOI structure undergoing analysis, according to another example embodiment of the present invention.

FIG. 5 shows an integrated circuit die 540 undergoing analysis using an optically transparent substrate 530, and employing a heat exchanger 532 to remove heat generated during the electro-optic probing of the integrated circuit die 540. The removal of the silicon layer from the die 540 creates overheating problems during chip operation. The heat exchanger is adapted to draw heat from the die and thereby address the overheating problems. An integrated circuit die 540 having an exposed insulator layer 538 is provided. An index matching fluid 536 is placed onto the exposed insulator 538. An appropriate optically transparent substrate 530 that combines high optical transparency and high thermal conductivity is placed onto the index matching fluid 536. The high thermal conductivity allows the optically transparent substrate to function as a heat spreader. As shown, the length and width of the optically transparent substrate 530 are larger than those of the integrated circuit die 540, such that heat dissipation from the integrated circuit die 540 is readily achieved via the optically transparent substrate 530. A heat exchanger 532 is coupled with the optically transparent substrate 530 in order to maximize heat removal from the integrated circuit die 540 during electro-optic probing. The heat exchanger 532 includes a pipe through which a stream of chilled water flows and is contacted to the top periphery of the optically transparent substrate. The flow rate and temperature of the water is adjustable to control the amount of heat removed by the heat exchanger 532.

Laser light 534 from an electro-optic probe's laser beam passes through the optically transparent substrate 530. In this implementation, the laser light 534 does not travel through the heat exchanger 532 due to the heat exchanger 532 only contacting the substrate's 30 top periphery (e.g., shown by portions 531 and 533, with a center portion 535 being open for passing the laser light 534). After the beam 534 passes through the substrate 530, it proceeds through the index matching fluid layer 536, the insulator layer 538, and reflects back after striking the diffusion region near the circuit side of the die 540.

In another example embodiment (not shown), an appropriate optically transparent substrate, such as that illustrated in FIG. 5, has a heat exchanger incorporated therein. Using FIG. 5 as an example, the heat exchanger 532 and substrate 530 are one unit. The heat exchanger 532 includes fluid channels around the perimeter of the attached optically transparent substrate through which a chilled fluid is passed. Using different fluids with different heat transfer coefficients, as well as the selected flow rate and temperature of the fluid, affect the heat transfer rate. These parameters can be selected for optimal cooling based upon the selected type of die and analysis to be performed. An anti-reflective coating is placed on either the top 542, bottom 530, or both surfaces of the combination optically transparent substrate and heat exchanger device.

In another example embodiment, a gas, such as nitrogen, air or other suitable gas is used to remove heat from the stimulated chip in FIG. 5. The use of gas is applicable both when an optically transparent substrate is used, and when an anti-reflective coating is formed directly on the exposed insulator surface. Using a gas supply 544, a stream of gas 546 is passed over the backside of the substrate or insulator. Reducing the ambient temperature, increasing the gas flow, or cooling the stream of gas all enhance the ability to maintain the die cool.

In another example embodiment (not shown), the optically transparent substrate 530 of FIG. 5 is modified to increase its surface area using fins. The increased surface area allows the substrate to operate as a more efficient heat spreader. A cooled gas stream 546 is passed over the optically transparent substrate during chip stimulation thereby keeping the chip from overheating.

In another example embodiment of the present invention, an integrated circuit die includes a buried insulator layer as part of SOI structure, with the buried insulator layer including a buried oxide layer (BOX). The die is prepared for analysis by first mechanically grinding the silicon layer, followed by etching using an aqueous solution of tetra methyl ammonium hydroxide (TMAH) until the entire silicon layer is removed, and the BOX is exposed over the entire surface. An index matching fluid of mineral oil of refractive index in the range of 1.5–1.8 is placed between the diamond substrate and the exposed BOX layer to reduce reflections associated with surface irregularities. An optically transparent substrate, such as polycrystalline or single crystalline diamond having a thickness of about 200–400 micrometers, is used as the optically transparent substrate. The high optical transparency of diamond along with its high thermal conductivity makes it a suitable substrate. The top surface of the diamond substrate is coated with an anti-reflective film. The specific anti-reflective coating used is dependent on the wavelength of the laser used to perform the electro-optic probing. In one embodiment, a single or double layer dielectric film is used to correspond to a laser wavelength of ~1064 nm. In other embodiments, an electro-optic laser probe uses a wavelength of ~1320 nm, and a single or double layer dielectric film that corresponds to this wavelength is used.

In this example embodiment, the top periphery of a diamond substrate is contacted to a heat exchanger through which a chilled fluid is passed. The combination of a diamond heat spreader and a heat exchanger effectively removes the heat from the die during probing. The die is electro-optically probed through the optically transparent diamond substrate. During electro-optic probing of the die, the optical reflectance of a pulsed laser beam is measured. The voltage at the circuit drain (or source) changes with time during the operation of the circuit. Voltage changes at the drain cause changes in the refractive index of silicon near the drain, and are detected as amplitude modulation in the optical reflectance.

According to another example embodiment of the present invention, a probe, such as an electro-optic probe, is used to detect changes in refractive indices of an electro-optic crystal placed at a semiconductor die having SOI structure. The detected change in the polarization state of a laser beam in the crystal is used, for example, to detect an electrical characteristic in the die. A portion of the back side of the die is removed, and the electro-optic crystal is placed at the removed portion. Light from a probe is directed at the die, and the reflection of the light passes through the crystal and is detected. The die is stimulated, and the crystal responds to electrical changes, such as changes in voltage or electric field, in the die. The response of the crystal affects the reflected beam, and this change in the reflection is detected and used as an indication of an electrical characteristic in the die.

Various electrical characteristics can be detected in this manner. For example, the voltage of source/drain regions affect the crystal, and a change in the reflection can be correlated to a particular voltage level, using empirical data or other known characteristics of the die to relate the change in the reflection to the voltage. This is useful for measuring static voltages at a source region, which can be used to detect defects in contacts to the die circuitry, or for measuring the voltage at a drain region as a function of time. Other defects, such as short and open circuits, timing delays and speed-limiting defects can be detected in a similar manner as a function of time using a commonly-employed method, such as a stroboscopic sampling method.

The probe used is selected to make possible the focusing of the probe upon a selected area of interest in the die. In one implementation, the probe includes an electro-optic probe that has a correction ring and an objective lens that are interactively adjusted to achieve focus upon a circuit region of interest.

In another example embodiment of the invention, a test pattern is applied to the integrated circuit die. The test pattern is selected for a particular purpose for which the die analysis is being performed. For instance, the pattern is selected to simulate operating conditions that potentially cause circuit failure when such conditions are desired to be analyzed. In addition, the test patterns can be applied in a loop to cycle the circuit through multiple failure conditions. The probe is used to obtain a response from the circuit to the looped pattern. In another instance, the test pattern is selected to cause the die to operate at speeds exceeding the design speed, and high speed operation of the die is thereby monitored.

Figure 6:
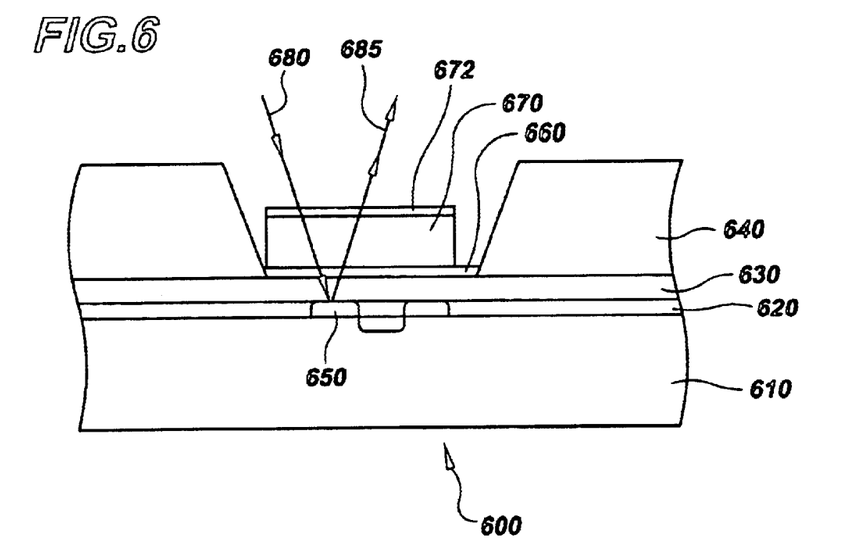
FIG. 6 is an integrated circuit die having SOI structure undergoing analysis with an electro-optic crystal, according to another example embodiment of the present invention.

FIG. 6 shows a more particular example embodiment of the present invention wherein an integrated circuit die 600 having SOI structure is undergoing analysis. A portion of the back side 640 of the die is removed to expose an insulator portion 630 of the SOI structure, and an index matching fluid 660 is applied to the exposed insulator. The index matching fluid is selected to reduce or eliminate reflections from the interface between the crystal and the die. An electro-optic crystal 670 having a transparent electrode 672 is placed on the index matching fluid. A voltage is applied to the electrode, the die is stimulated and light 680 is directed at a source/drain region 650 located in a thin layer 620 of silicon near a circuit side 610 of the die. The light is reflected and the reflection 685 passes through the crystal. The stimulation of the die causes a voltage change in the source/drain region 650, which acts with the voltage applied to the electrode to form a parallel plate capacitor that affects the refractive index of the crystal 670. A change in the refractive index alters the reflection 685, and the altered reflection is detected and used to detect an electrical characteristic of the die.

Figure 7:
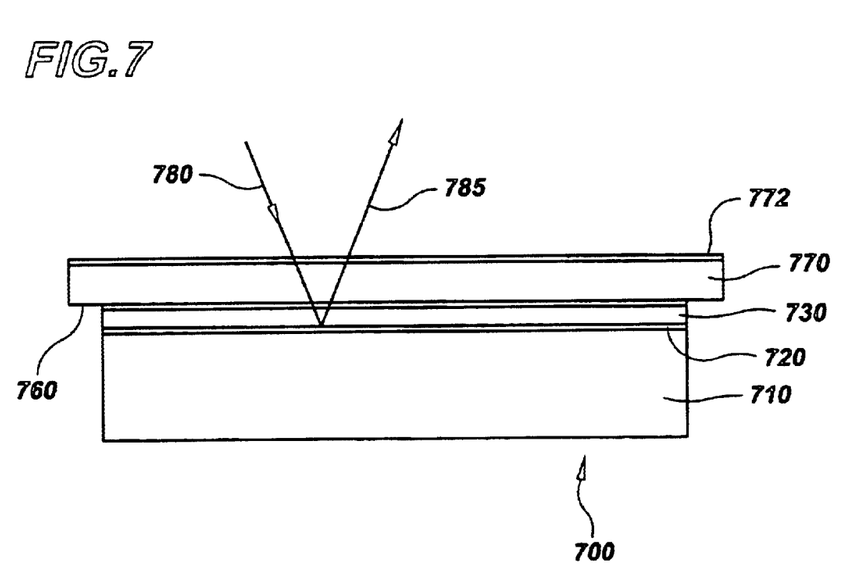
FIG. 7 is an integrated circuit die having SOI structure undergoing analysis with an electro-optic crystal, according to another example embodiment of the present invention.

In another example embodiment of the present invention, FIG. 7 shows a semiconductor die 700 having SOI structure undergoing analysis. The die is prepared for analysis by first globally thinning the die to a thickness of about 50–100 microns using parallel polishing or a similar technique. The die is then chemically etched using a TMAH solution of approximately 15–30% by weight in water at a temperature between about 70 and 90 degrees Celsius until a buried oxide (BOX) insulator portion 730 of the die is exposed. The die is washed with de-ionized (DI) water to remove TMAH residue, and then washed in isopropyl alcohol and dried.

The prepared die is inserted into a load module adapted to electrically stimulate the die, and an index matching fluid 760 is placed on the exposed surface of the BOX. A lithium niobate (LiNbO$_3$) crystal 770 having a thickness between about 200 and 500 microns and a size larger than that of the die is used to electrically couple a signal from the die. In this implementation, the crystal has a trigonal crystalline structure, is uniaxial and either Z-cut or X-cut with major surfaces perpendicular to the optic axis. Upper and lower surfaces of the crystal are polished optically smooth and an electrically conducting and optically transparent dielectric film 772 that acts as an electrode is coated on the polished upper surface of the crystal. The film is made of a material such as tin oxide, indium oxide, cadmium oxide or a mixture of indium oxide and tin oxide referred to as indium tin oxide (ITO). The crystal is placed over the die such that the optically transparent dielectric film 772 is separated from the die surface. An external electrical connection is made to the optically transparent dielectric film 772. In one implementation, the electrode is grounded, and in another implementation, a voltage is applied to the electrode. A cooling mechanism, such as one that includes the application of a thermal solution, air or other gas to the die to remove heat from the die is optionally used.

The die 700 is then electrically stimulated, and laser light 780 from an electro-optic probe is directed at a selected portion of circuitry in a thin silicon layer 720 in the die. A portion 785 of the light is reflected and passes through the crystal 770. The stimulated die and the electrode 772 act as a parallel plate capacitor to affect the crystal 770. Changes in the crystal, such as changes in the refractive indices due to the index ellipsoid being perturbed by a change in electric field, cause changes in the phase of the optical electric field. This causes changes in the reflected light that can be detected, such as by using an IDS2000 system, available from Schlumberger of San Jose, Calif., to sense phase modulation using a phase comparator and converting the phase modulation to intensity or amplitude modulation.

The intensity or amplitude modulation is detected and used to detect an electrical characteristic of the die that is causing the change in the crystal. For example, the modulation can be displayed on a computer screen or printed for viewing. The amount of intensity of amplitude change is noted and compared to a reference or other known, and variances are noted as changes in electrical characteristics of the die. In one instance, the amount of modulation is correlated to a voltage state at which a source/drain region being probed is. In this manner, the voltage characteristic of circuitry in the SOI portion of the die during die operation can be detected.

Figure 8:
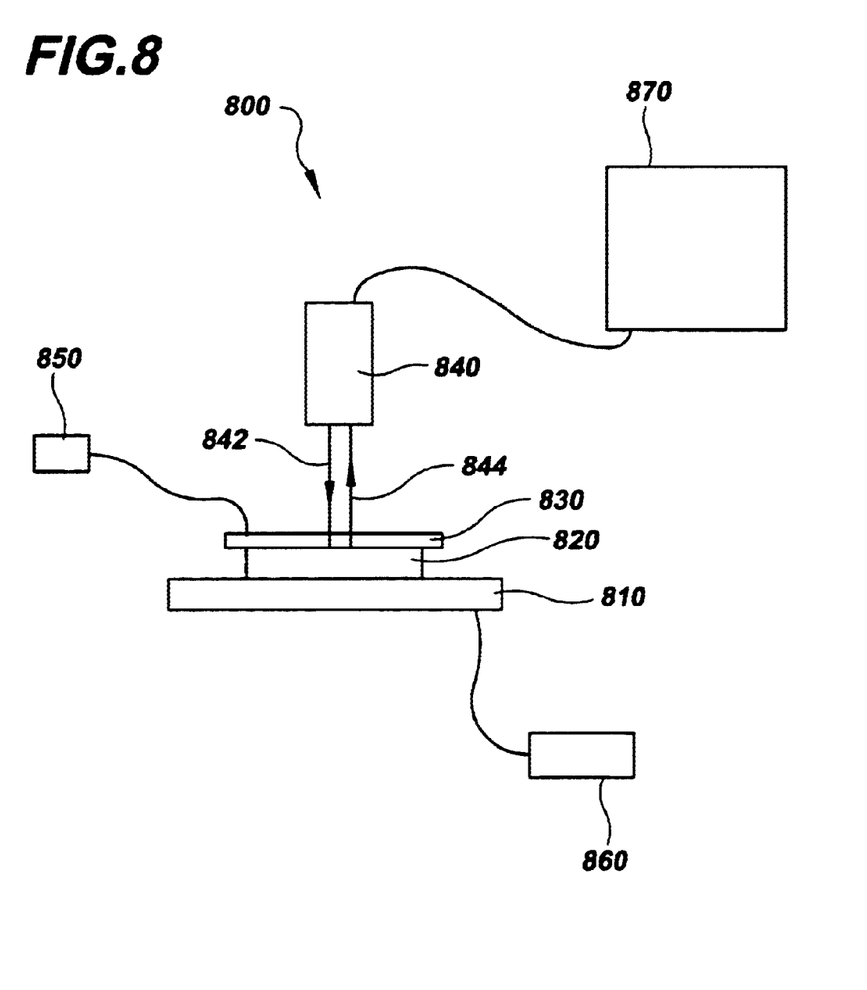
FIG. 8 is a system adapted for electro-optic probing, according to another example embodiment of the present invention.

A system 800 for analyzing an integrated circuit die having SOI structure is shown in FIG. 8, according to another example embodiment of the present invention. A stage 810 is adapted to electrically couple to a die 820 undergoing analysis. An electro-optic crystal arrangement 830 having an electrode is adapted to be placed on the die with the electrode facing away from the die and forming a parallel plate capacitor with circuitry in the die. A voltage supply 850 is coupled to the electrode and adapted to supply a voltage to and/or to ground the electrode. A stimulation device 860 is adapted to supply electrical signals to the die 820 via the stage 810. An electro-optic probe 840 is arranged over the stage and adapted to probe the die 820 via the crystal 830. The probe directs a laser beam 842 at the die, and detects a reflection 844 from the die that passes through the crystal. The crystal is adapted to change in response to an electrical field produced by the die, and this change affects the reflection. The detected reflection is used by a controller 870 adapted to control the probe 840 and to correlate a phase change of the reflection to a modulation that can be used to determine the electrical characteristic of the die that causes a change in the crystal.

In a more particular implementation, the controller 870 includes a display adapted to display a voltage waveform, such as those shown in FIG. 4. The voltage waveform provides information which, through various analysis techniques, verifies performance or depicts defects within an integrated circuit die. For example, comparing a generated waveform to a reference waveform from a die known to contain a defect may show if that defect exists in the tested chip. In this regard, the computer is adapted to overlay a detected waveform with the reference waveform for comparison. Alternatively, comparison of the waveform to that of a die known to be non-defective may indicate that the tested chip does not contain a defect. The generated waveform therefore may be used to detect the condition of the integrated circuit die through comparisons to reference waveforms.

In another more particular arrangement, the system 800 further includes a substrate removal arrangement adapted to remove substrate from the back side of the die and to expose the insulator portion of the SOI structure. The substrate removal arrangement optionally includes more than one type of removal device, such as a polishing device, a chemical etching device, and a laser-etching device. In one implementation, the system further includes a washing arrangement adapted to wash the die with sufficient DI water to remove etch residue and with isopropyl alcohol, wherein the die can be air-dried subsequent to washing.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing an integrated circuit die having a silicon on insulator (SOI) structure, the method comprising:
stimulating the integrated circuit die; and
sufficiently focusing an electro-optic probe at a selected portion of the SOI structure and detecting a response to the stimulating of the SOI selected portion.

2. The method of claim 1, wherein sufficiently focusing an electro-optic probe includes interactively adjusting a correction ring and an objective lens of the probe.

3. The method of claim 1, wherein detecting a response includes detecting a voltage waveform and using the waveform to analyze the die.

4. The method of claim 3, wherein using the waveform includes comparing the waveform to a reference waveform from a defective integrated circuit die and detecting a condition of the die therefrom.

5. The method of claim 3, wherein using the waveform includes comparing the waveform to a reference waveform from a non-defective integrated circuit die and detecting a condition of the die therefrom.

6. The method of claim 1, wherein detecting a response includes detecting a changing in carrier density in a drain diffusion area of the SOI structure.

7. The method of claim 1, wherein detecting a response includes detecting a change in refractive index of a drain diffusion area of the SOI structure.

8. The method of claim 1, wherein detecting a response includes detecting a change in light absorption coefficient of a drain diffusion area of the SOI structure.

9. The method of claim 1, wherein stimulating the integrated circuit includes pulsing the circuit at a frequency range of between about 200 MHz and 400 MHz.

10. The method of claim 1, wherein stimulating the integrated circuit includes applying a test pattern selected to simulate operating characteristics that cause circuit failure.

11. An arrangement for analyzing an integrated circuit having silicon on insulator (SOI) structure, the arrangement comprising:
means for stimulating the integrated circuit; and
means for sufficiently focusing a selected portion of the SOI structure using an electro-optic probe and detecting a response to the stimulation of the selected portion.

12. A system for analyzing an integrated circuit die having a silicon on insulator (SOI) structure, the system comprising:

a stimulation device adapted to stimulate the integrated circuit; and an electron-optic probe device adapted to sufficiently focus upon a selected portion of the SOI structure and to detect a response from the selected portion.

13. A system according to claim 12, wherein the electro-optic probe includes a correction ring and an objective lens, the ring and lens being interactively adjustable to focus the probe upon the selected portion to make possible detection of the response.

14. The system of claim 12, wherein the electro-optic probe is adapted to obtain a signal representing a change in free carrier density in a drain region of the die.

15. The system of claim 14, wherein the signal includes a voltage signal.

16. The system of claim 12, further comprising a computer arrangement communicatively coupled to the electro-optic probe and adapted to use the detected response to analyze the die.

17. The system of claim 16, wherein the computer arrangement is adapted to display an image of the response.

18. The system of claim 16, wherein the computer arrangement is further communication coupled to the stimulation device and adapted to correlate the stimulation with the detected response.

19. The system of claim 18, wherein the computer arrangement is further adapted to generate a voltage waveform that provides a relationship between the stimulation to the response.

20. The system of claim 18, wherein the computer arrangement is further adapted to control the stimulation device.

* * * * *

UNITED STATES PATENT AND TRADEMARK OFFICE
CERTIFICATE OF CORRECTION

PATENT NO. : 6,833,716 B1
DATED : December 21, 2004
INVENTOR(S) : Goruganthu et al.

It is certified that error appears in the above-identified patent and that said Letters Patent is hereby corrected as shown below:

Column 14,
Line 5, "claim 16" should read -- claim 12 --.
Line 6, "communication" should read -- communicatively --.

Signed and Sealed this

Seventeenth Day of May, 2005

JON W. DUDAS
*Director of the United States Patent and Trademark Office*